(12) United States Patent
Forbes

(10) Patent No.: US 7,479,428 B2
(45) Date of Patent: Jan. 20, 2009

(54) NROM FLASH MEMORY WITH A HIGH-PERMITTIVITY GATE DIELECTRIC

(76) Inventor: Leonard Forbes, 965 NW. Highland Ter., Corvallis, OR (US) 97330

( * ) Notice: Subject to any disclaimer, the term of this patent is extended or adjusted under 35 U.S.C. 154(b) by 0 days.

(21) Appl. No.: 11/208,921

(22) Filed: Aug. 22, 2005

(65) Prior Publication Data

US 2006/0019453 A1    Jan. 26, 2006

Related U.S. Application Data

(62) Division of application No. 10/775,908, filed on Feb. 10, 2004, now Pat. No. 7,221,018.

(51) Int. Cl.
*H01L 21/8247* (2006.01)
(52) U.S. Cl. .................. 438/261; 257/E21.179
(58) Field of Classification Search ............... 438/287, 438/785, 257–267, 954; 257/E21.179
See application file for complete search history.

(56) References Cited

U.S. PATENT DOCUMENTS

| | | |
|---|---|---|
| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |
| 5,620,559 A * | 4/1997 | Kikuchi ............ 438/723 |
| 5,768,192 A | 6/1998 | Eitan |
| 5,792,697 A | 8/1998 | Wen |
| 5,858,841 A | 1/1999 | Hsu |
| 5,911,106 A | 6/1999 | Tasaka |

(Continued)

FOREIGN PATENT DOCUMENTS

EP    84303740.9    1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Richard A. Booth
(74) *Attorney, Agent, or Firm*—Leffert Jay & Polglaze, P.A.

(57) ABSTRACT

A high permittivity gate dielectric is used in an NROM memory cell. The gate dielectric has a dielectric constant greater than silicon dioxide and is comprised of an atomic layer deposited and/or evaporated nanolaminate structure. The NROM memory cell has a substrate with doped source/drain regions. The high-k gate dielectric is formed above the substrate between a pair of the source/drain regions. A polysilicon control gate is formed on top of the gate dielectric. The gate dielectric can have an oxide-high-k dielectric-oxide composite structure, an oxide-nitride-high-k dielectric composite structure, or a high-k dielectric-high-k dielectric-high-k dielectric composite structure.

6 Claims, 4 Drawing Sheets

U.S. PATENT DOCUMENTS

| | | | |
|---|---|---|---|
| 5,946,558 A | 8/1999 | Hsu | |
| 5,966,603 A | 10/1999 | Eitan | |
| 5,994,745 A | 11/1999 | Hong | |
| 6,011,725 A | 1/2000 | Eitan | |
| 6,013,553 A * | 1/2000 | Wallace et al. | 438/287 |
| 6,028,342 A | 2/2000 | Chang | |
| 6,030,871 A | 2/2000 | Eitan | |
| 6,044,022 A | 3/2000 | Nachumovsky | |
| 6,081,456 A | 6/2000 | Dadashev | |
| 6,108,240 A | 8/2000 | Lavi | |
| 6,133,102 A | 10/2000 | Wu | |
| 6,147,904 A | 11/2000 | Liron | |
| 6,157,570 A | 12/2000 | Nachumovsky | |
| 6,172,396 B1 | 1/2001 | Chang | |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,222,768 B1 | 4/2001 | Hollmer | |
| 6,240,020 B1 | 5/2001 | Yang | |
| 6,243,300 B1 | 6/2001 | Sunkavalli | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,348,711 B1 | 2/2002 | Eitan | |
| 6,392,930 B2 | 5/2002 | Jung | |
| 6,417,053 B1 | 7/2002 | Kuo | |
| 6,421,275 B1 | 7/2002 | Chen | |
| 6,429,063 B1 | 8/2002 | Eitan | |
| 6,432,778 B1 | 8/2002 | Lai | |
| 6,455,890 B1 | 9/2002 | Chang | |
| 6,461,949 B1 | 10/2002 | Chang | |
| 6,468,864 B1 | 10/2002 | Sung | |
| 6,469,342 B1 | 10/2002 | Kuo | |
| 6,477,084 B1 | 11/2002 | Eitan | |
| 6,486,028 B1 | 11/2002 | Chang | |
| 6,487,050 B1 | 11/2002 | Liu | |
| 6,498,377 B1 | 12/2002 | Lin | |
| 6,514,831 B1 | 2/2003 | Liu | |
| 6,531,887 B2 | 3/2003 | Sun | |
| 6,545,309 B1 | 4/2003 | Kuo | |
| 6,552,387 B1 | 4/2003 | Eitan | |
| 6,559,013 B1 | 5/2003 | Pan | |
| 6,576,511 B2 | 6/2003 | Pan | |
| 6,580,135 B2 | 6/2003 | Chen | |
| 6,580,630 B1 | 6/2003 | Liu | |
| 6,602,805 B2 | 8/2003 | Chang | |
| 6,607,957 B1 | 8/2003 | Fan | |
| 6,610,586 B1 | 8/2003 | Liu | |
| 6,613,632 B2 | 9/2003 | Liu | |
| 6,617,204 B2 | 9/2003 | Sung | |
| 6,660,660 B2 | 12/2003 | Haukka | |
| 6,669,990 B2 | 12/2003 | Min | |
| 6,674,138 B1 * | 1/2004 | Halliyal et al. | 257/411 |
| 6,713,812 B1 | 3/2004 | Hoefler | |
| 6,780,708 B1 | 8/2004 | Kinoshita | |
| 6,797,567 B2 | 9/2004 | Chang | |
| 6,847,063 B2 * | 1/2005 | Ohnishi et al. | 257/197 |
| 6,921,702 B2 * | 7/2005 | Ahn et al. | 438/287 |
| 2001/0001075 A1 | 5/2001 | Ngo | |
| 2001/0004332 A1 | 6/2001 | Eitan | |
| 2001/0011755 A1 | 8/2001 | Tasaka | |
| 2002/0086548 A1 | 7/2002 | Chang | |
| 2002/0142569 A1 | 10/2002 | Chang | |
| 2002/0146885 A1 | 10/2002 | Chen | |
| 2002/0151138 A1 | 10/2002 | Liu | |
| 2002/0155689 A1 | 10/2002 | Ahn et al. | |
| 2002/0177275 A1 | 11/2002 | Liu | |
| 2002/0182829 A1 | 12/2002 | Chen | |
| 2003/0057997 A1 | 3/2003 | Sun | |
| 2003/0067807 A1 | 4/2003 | Lin | |
| 2003/0117861 A1 | 6/2003 | Maayan | |
| 2005/0212065 A1 | 9/2005 | Forbes | |
| 2005/0269652 A1 | 12/2005 | Forbes | |
| 2005/0272206 A1 | 12/2005 | Forbes | |
| 2005/0280045 A1 | 12/2005 | Forbes | |
| 2005/0285185 A1 | 12/2005 | Forbes | |

FOREIGN PATENT DOCUMENTS

| | | |
|---|---|---|
| EP | 90115805.5 | 2/1991 |
| EP | 01113179.4 | 12/2002 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp.76-77, 407-408. Copyright 1990 IEEE.

M. Janai, "Data Retention, Endurance and Acceleration Factors of NROM Devices," IEEE 41st Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "E²PROM Product Issues and Technology Trends," IEEE 1989, pp. 17-19, Copyright 1989 IEEE.

T. Huang, F. Jong, T. Chao, H. Lin, L. Leu, K. Young, C. Lin, K. Chiu, "Improving Radiation Hardness of EEPROM/Flash Cell BY $N_2O$ Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide -Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A $TiSi_2$ Control Gate," IEEE 1989, pp. 25.8.1-1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, Date Unknown.

T. Sugizaki, et al. "New 2-bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, Ltd. PowerPoint Presentation, Date Unknown.

Y. Roizin, et al. "Novel Techniques for data retention and Leff measurements in two bit MicroFlash® Memory Cells," Characterization and Metrology for ULSI Technology: 200 International Conf., pp. 181-185, Copyright 2001 American Institute of Physics, 1-56396-967-X/01.

W. J. Tsai, et al., "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™-a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide(ONO) Gates for NROM™ Non-Volatile Semiconductor Memory Devices," Extended Abstracts of the 2001 International Conference on Soild State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in microFLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXV AND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Tehcnical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of microFLASH® Memory (Activation Energy of Traps in the ONO Stack)," Tower Semiconductor, Ltd., Date Unknown.

Y. Roizin, et al., "Activation Energy of Traps in the ONO Stack of microFLASH® Memory Cells," Tower Semiconductor, Ltd., Date Unknown.

Y. Roizin, et al., "'Dummy' Gox for Optimization of microFLASH® Technology," Tower Semiconductor, Ltd., Date Unknown.

Y. K. Lee, et al., "Multi-Level Vertical Channel SONOS Nonvolatile Memory on SOI," 2002 Symposium on VSLI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

* cited by examiner

NROM FLASH MEMORY WITH A HIGH-PERMITTIVITY GATE DIELECTRIC

RELATED APPLICATION

This Application is a Divisional of U.S. application Ser. No. 10/775,908, titled "NROM FLASH MEMORY WITH A HIGH-PERMITTIVITY GATE DIELECTRIC," filed Feb. 10, 2004, now U.S. Pat. No. 7,221,018 which is commonly assigned and incorporated herein by reference.

TECHNICAL FIELD OF THE INVENTION

The present invention relates generally to memory devices and in particular the present invention relates to nitride read only memory (NROM) flash memory device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. One type of flash memory is a nitride read only memory (NROM). NROM has some of the characteristics of flash memory but does not require the special fabrication processes of flash memory. NROM integrated circuits can be implemented using a standard CMOS process.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations. For example, stress induced leakage typically requires a tunnel oxide above 60 Å. This thickness results in a scaling limit on the gate length. Additionally, this gate oxide thickness limits the read current and may require large gate widths.

For the reasons stated above, and for other reasons stated below which will become apparent to those skilled in the art upon reading and understanding the present specification, there is a need in the art for a more scalable, higher performance flash memory transistor.

SUMMARY

The above-mentioned problems with flash memory scaling and performance and other problems are addressed by the present invention and will be understood by reading and studying the following specification.

The present invention encompasses an NROM flash memory transistor with a high permittivity gate dielectric. The transistor is comprised of a substrate with a plurality of source/drain regions. The source/drain regions have a different conductivity than the substrate into which they are doped.

A high-k gate dielectric is formed on the substrate substantially between the plurality of source/drain regions. The gate dielectric has a high dielectric constant that is greater than silicon dioxide. The gate dielectric can be an atomic layer deposited and/or evaporated nanolaminate gate dielectric. A control gate is formed on top of the oxide insulator.

Further embodiments of the invention include methods and apparatus of varying scope.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
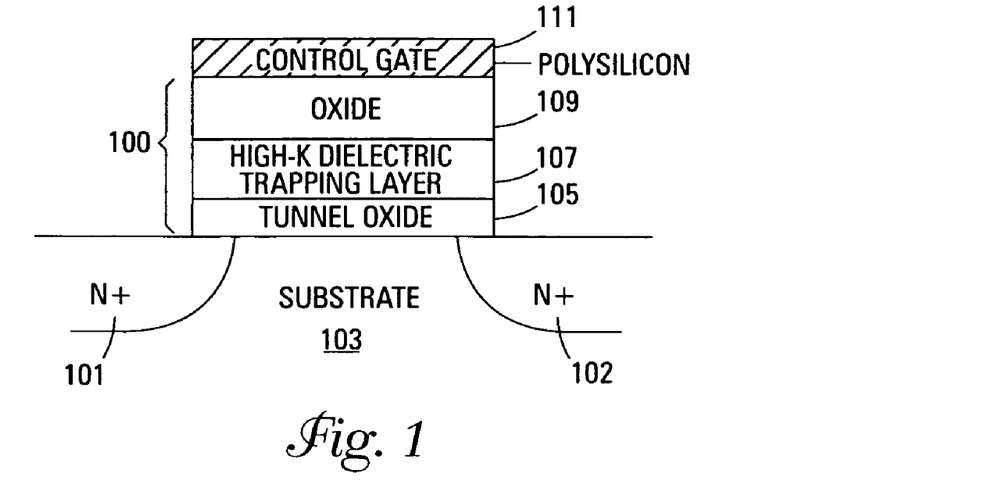
FIG. 1 shows a cross-sectional view of one embodiment of an NROM flash memory cell transistor of the present invention.

FIG. 1 illustrates a cross-sectional view of one embodiment of a nitride read only memory (NROM) flash memory cell transistor of the present invention. This NROM transistor uses the high-k dielectric layer of the present invention as a trapping layer. In order to improve the programming speed and/or lower the programming voltage of an NROM device, it is desirable to use a trapping material with a lower conduction band edge (i.e., a higher electron affinity) to achieve a larger offset as well as to provide for programming by direct tunneling at low voltages.

High permittivity dielectric materials such as $HfO_2$ and $ZrO_2$ have a lower conduction band edge than the prior art trapping material, silicon nitride. If $HfO_2$ were used as a trapping layer, the offset would be 1.7 eV that is much better than the 1.2 eV associated with a nitride trapping layer.

The transistor is comprised of two source/drain regions 101 and 102 doped into the substrate 103. In one embodiment, these are n+regions and the substrate is p-type silicon. However, the present invention is not limited to any conductivity type.

A tunnel oxide layer 105 is formed on the substrate 103 between the source/drain regions 101 and 102. The high dielectric constant trapping layer 107 is formed on top of the tunnel oxide layer 105 and another oxide layer 109 is formed on top of the trapping layer 107. The oxide-high-k dielectric-oxide layers 105, 107, and 109 form a composite gate insulator 100 under the polysilicon control gate 111. In one embodiment, the nanolaminate gate insulator 100 can be fabricated by the above-described ALD, the evaporated technique, or a combination of the two.

Figure 2:
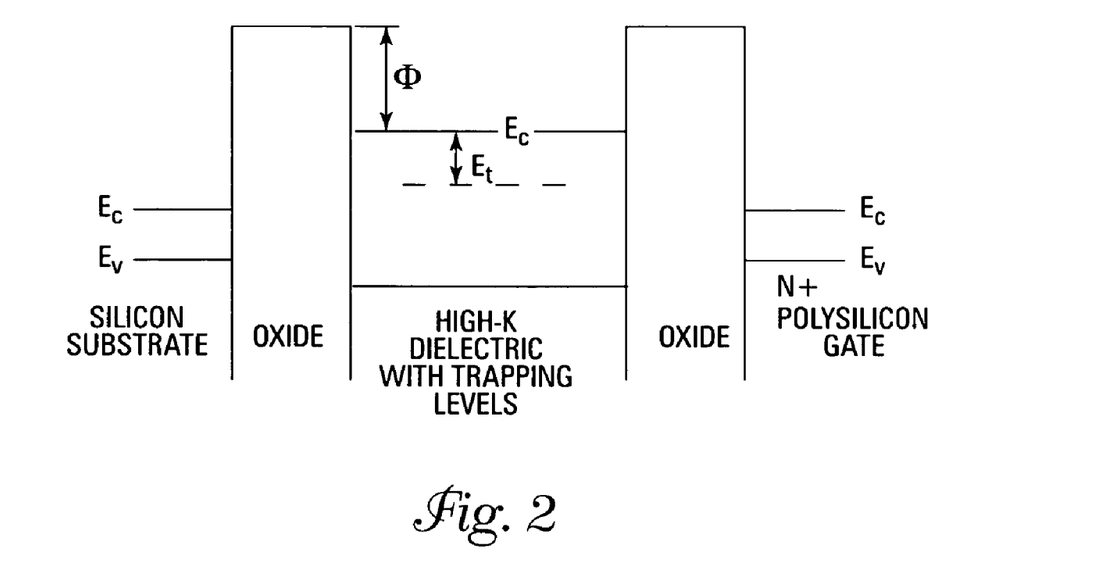
FIG. 2 shows an energy-band diagram in accordance with the transistor of FIG. 1.

The simplest nanolaminates with high-k dielectrics are oxide-high-k dielectric-oxide composites. Since silicon dioxide has a low electron affinity and high conduction band offset with respect to the conduction band of silicon, these nanolaminates have a high barrier, $\Phi$, between the high-k dielectric and the oxide. If the trapping center energies, $E_t$, in the high-k dielectrics illustrated in FIG. 2 are large then other high-k dielectrics with a smaller barrier can be used.

Examples of oxide-high-k dielectric-oxide composites include: oxide-ALD $HfO_2$-oxide, oxide-evaporated $HfO_2$-oxide, oxide-ALD $ZrO_2$-oxide, oxide-evaporated $ZrO_2$-oxide, oxide-ALD ZrSnTiO-oxide, oxide-ALD ZrON-oxide, oxide-ALD ZrAlO-oxide, oxide-ALD $ZrTiO_4$-oxide, oxide-ALD $Al_2O_3$-oxide, oxide-ALD $La_2O_3$-oxide, oxide-$LaAlO_3$-oxide, oxide-evaporated $LaAlO_3$-oxide, oxide-ALD $HfAlO_3$-oxide, oxide-ALD HfSiON-oxide, oxide-evaporated $Y_2O_3$-oxide, oxide-evaporated $Gd_2O$-oxide, oxide-ALD $Ta_2O_5$-oxide, oxide-ALD $TiO_2$-oxide, oxide-evaporated $TiO_2$-oxide, oxide-ALD $PrO_3$-oxide, oxide-evaporated $PrO_3$-oxide, oxide-evaporated $CrTiO_3$-oxide, and oxide-evaporated YSiO-oxide.

Another class of nanolaminates avoids tunneling between the trapping centers in the nitride layer of a conventional NROM device and the control gate. High-k dielectrics, in one embodiment, can be used as the top layer in the gate insulator nanolaminate. Since they have a much higher dielectric constant than silicon oxide, these layers can be much thicker and still have the same capacitance. The thicker layers avoid tunneling to the control gate that is an exponential function of electric fields but have an equivalent oxide thickness that is much smaller than their physical thickness.

Examples of this second category of nanolaminates include: oxide-nitride-ALD $Al_2O_3$, oxide-nitride-ALD $HfO_2$, and oxide-nitride-ALD $ZrO_2$.

A third category of nanolaminates employs traps in the high-k dielectrics that have a larger energy depth with respect to the conduction band in the high-k trapping layer than those in the first category. As a result, large offsets are not required between the layers in the nanolaminates and a wide variety of different nanolaminates are possible using only high-k dielectrics in these nanolaminates. The energy depths of the traps can be adjusted by varying process conditions.

Examples of this third category of nanolaminates include: ALD $HfO_2$-ALD $Ta_2O_5$-ALD $HfO_2$, ALD $La_2O_3$-ALD $HfO_2$-ALD $La_2O_3$, ALD $HfO_2$-ALD $ZrO_2$-ALD $HfO_2$, ALD Lanthanide (Pr, Ne, Sm, Gd, and Dy) Oxide-ALD $ZrO_2$-ALD Lanthanide (Pr, Ne, Sm, Gd, and Dy) Oxide, ALD Lanthanide Oxide-ALD $HfO_2$-ALD Lanthanide Oxide, and ALD Lanthanide Oxide-evaporated $HfO_2$-ALD Lanthanide Oxide.

In one embodiment, the high-k gate dielectric layer is fabricated using atomic layer deposition (ALD). As is well known in the art, ALD is based on the sequential deposition of individual monolayers or fractions of a monolayer in a well controlled manner. Gaseous precursors are introduced one at a time to the substrate surface and between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor.

ALD is well suited for deposition of high-k dielectrics such as $AlO_x$, $LaAlO_3$, $HfAlO_3$, $Pr_2O_3$, Lanthanide-doped $TiO_x$, HfSiON, Zr—Sn—Ti—O films using $TiCl_4$ or $TiI_4$, ZrON, $HfO_2$/Hf, $ZrAlXO_y$, $CrTiO_3$, and $ZrTiO_4$.

The most commonly used oxygen source materials for ALD are water, hydrogen peroxide, and ozone. Alcohols, oxygen and nitrous oxide have also been used. Of these, oxygen reacts very poorly at temperatures below 600° C. but the other oxygen sources are highly reactive with most of the metal compounds listed above.

Source materials for the above-listed metals include: zirconium tetrachloride ($ZrCl_4$) for the Zr film, titanium tetraisopropoxide ($Ti(OCH(CH_3)_2)_4$) for the Ti film, trimethyl aluminum ($Al(CH_3)_3$) for the Al film, chromyl chromide ($CrO_2Cl_2$) for the Cr film, praseodymium chloride ($PrCl_3$) for the Pr film, and hafnium chloride ($HfCl_4$) for the Hf film. Alternate embodiments use other source materials.

Thin oxide films are deposited at a temperature that is high enough such that, when it is adsorbed to the substrate surface, the vaporized source material reacts with a molecular layer of a second source material or that the vaporized source material becomes adsorbed and reacts with the second source material directed to the substrate surface in the subsequent step. On the other hand, the temperature should be low enough such that thermal breakdown of the source material does not occur or that its significance in terms of the total growth rate of the film is very small. Regarding the above-listed metals, the ALD process is carried out at a temperature range of approximately 200-600° C. Alternate embodiments use other temperature ranges.

In another embodiment of the NROM memory transistor of the present invention, the high-k dielectric layers can be fabricated using evaporation techniques. Various evaporation techniques are subsequently described for the high dielectric constant materials listed above.

Very thin films of $TiO_2$ can be fabricated with electron-gun evaporation from a high purity $TiO_2$ slug (e.g., 99.9999%) in a vacuum evaporator in the presence of anion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3-4 in. in diameter) is located above the electron gun and argon gas is used to generate Ar ions to bombard the substrate surface uniformly during the film deposition to compact the growing $TiO_2$ film.

A two-step process is used in fabricating a high purity $HfO_2$ film. This method avoids the damage to the silicon surface by Ar ion bombardment, such as that encountered during Hf metal deposition using dc sputtering. A thin Hf film is deposited by simple thermal evaporation. In one embodiment, this is by electron-beam evaporation using a high purity Hf metal slug (e.g., 99.9999%) at a low substrate temperature (e.g., 150°-200° C.). Since there is no plasma and ion bombardment of the substrate (as in the case of sputtering), the original atomically smooth surface of the silicon substrate is maintained. The second step is oxidation to form the desired $HfO_2$.

The first step in the deposition of CoTi alloy film is by thermal evaporation. The second step is the low temperature oxidation of the CoTi film at 400° C. Electron beam deposition of the CoTi layer minimizes the effect of contamination during deposition. The CoTi films prepared from an electron gun possess the highest purity because of the high-purity starting material. The purity of zone—refined starting metals can be as high as 99.999%. Higher purity can be obtained in deposited films because of further purification during evaporation.

A two step process in fabricating a high-purity $ZrO_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°-200° C.). Since there is no plasma and ion bombardment of the substrate, the original atomically smooth surface of the silicon substrate is maintained. The second step is the oxidation to form the desired $ZrO_2$.

The fabrication of $Y_2O_3$ and $Gd_2O_3$ films may be accomplished with a two step process. In one embodiment, an electron gun provides evaporation of high purity (e.g., 99.9999%) Y or Gd metal followed by low-temperature oxidation technology by microwave excitation in a $Kr/O_2$ mixed high-density plasma at 400° C. The method of the present invention avoids damage to the silicon surface by Ar ion bombardment such as that encountered during Y or Gd metal deposition sputtering. A thin film of Y or Gd is deposited by thermal evaporation. In one embodiment, an electron-beam evaporation technique is used with an ultra-high purity Y or Gd metal slug at a low substrate temperature (e.g., 150°-200° C.). Since there is no plasma or ion bombardment of the substrate, the original atomically smooth surface of the silicon substrate is maintained. The second step is the oxidation to form the desired $Y_2O_3$ or $Gd_2O_3$.

The desired high purity of a $PrO_2$ film can be accomplished by depositing a thin film by simple thermal evaporation. In one embodiment, this is accomplished by an electron-beam evaporation technique using an ultra-high purity Pr metal slug at a low substrate temperature (e.g., 150°-200° C.). Since there is no plasma and ion bombardment of the substrate, the original atomically smooth surface of the silicon substrate is maintained. The second step includes the oxidation to form the desired $PrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

The formation of a Y—Si—O film may be accomplished in one step by co-evaporation of the metal (Y) and silicon dioxide ($SiO_2$) without consuming the substrate Si. Under a suitable substrate and two-source arrangement, yttrium is evaporated from one source, and $SiO_2$ is from another source. A small oxygen leak may help reduce the oxygen deficiency in the film. The evaporation pressure ratio rates can be adjusted easily to adjust the Y—Si—O ratio.

The prior art fabrication of lanthanum aluminate ($LaAlO_3$) films has been achieved by evaporating single crystal pellets on Si substrates in a vacuum using an electron-beam gun. The evaporation technique of the present invention uses a less expensive form of dry pellets of $Al_2O_3$ and $La_2O_3$ using two electron guns with two rate monitors. Each of the two rate monitors is set to control the composition. The composition of the film, however, can be shifted toward the $Al_2O_3$ or $La_2O_3$ side depending upon the choice of dielectric constant. After deposition, the wafer is annealed ex situ in an electric furnace at 700° C. for ten minutes in $N_2$ ambience. In an alternate embodiment, the wafer is annealed at 800°-900° C. in RTA for ten to fifteen seconds in $N_2$ ambience.

FIG. 2 illustrates an energy-band diagram in accordance with the NROM flash transistor of FIG. 1. The diagram shows the relationship between $E_C$, $\Phi$, and the energy difference with respect to the conduction band edge in the high-k trapping layer, $E_t$.

Figure 3:
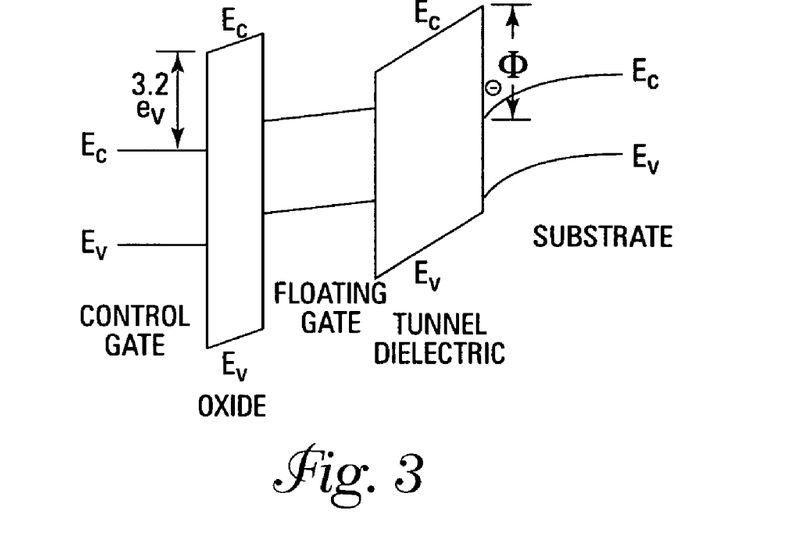
FIG. 3 shows an energy-band diagram in accordance with a write operation to the transistor structure of FIG. 1.
Figure 4:
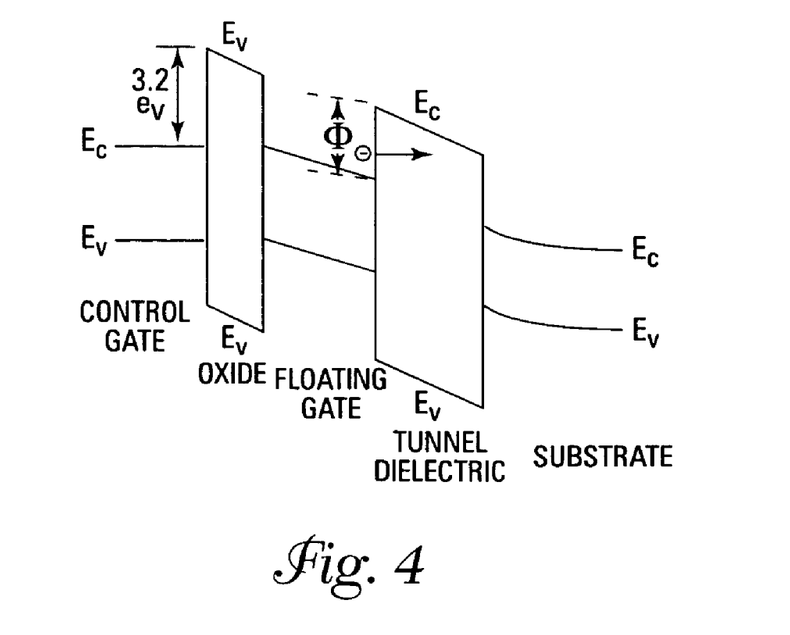
FIG. 4 shows an energy-band diagram in accordance with an erase operation from the transistor structure of FIG. 1.

FIG. 3 illustrates an energy-band diagram in accordance with a write operation in the transistor structure of FIG. 1 while FIG. 4 is the energy-band diagram for an erase operation. The diagrams show the conduction band edge, $E_C$, and the valence band edge, $E_V$. Between $E_C$ and $E_V$ is the band gap where there are no states for electrons. The energy barrier, $\Phi$, is the discontinuity in the conduction bands.

Figure 5:
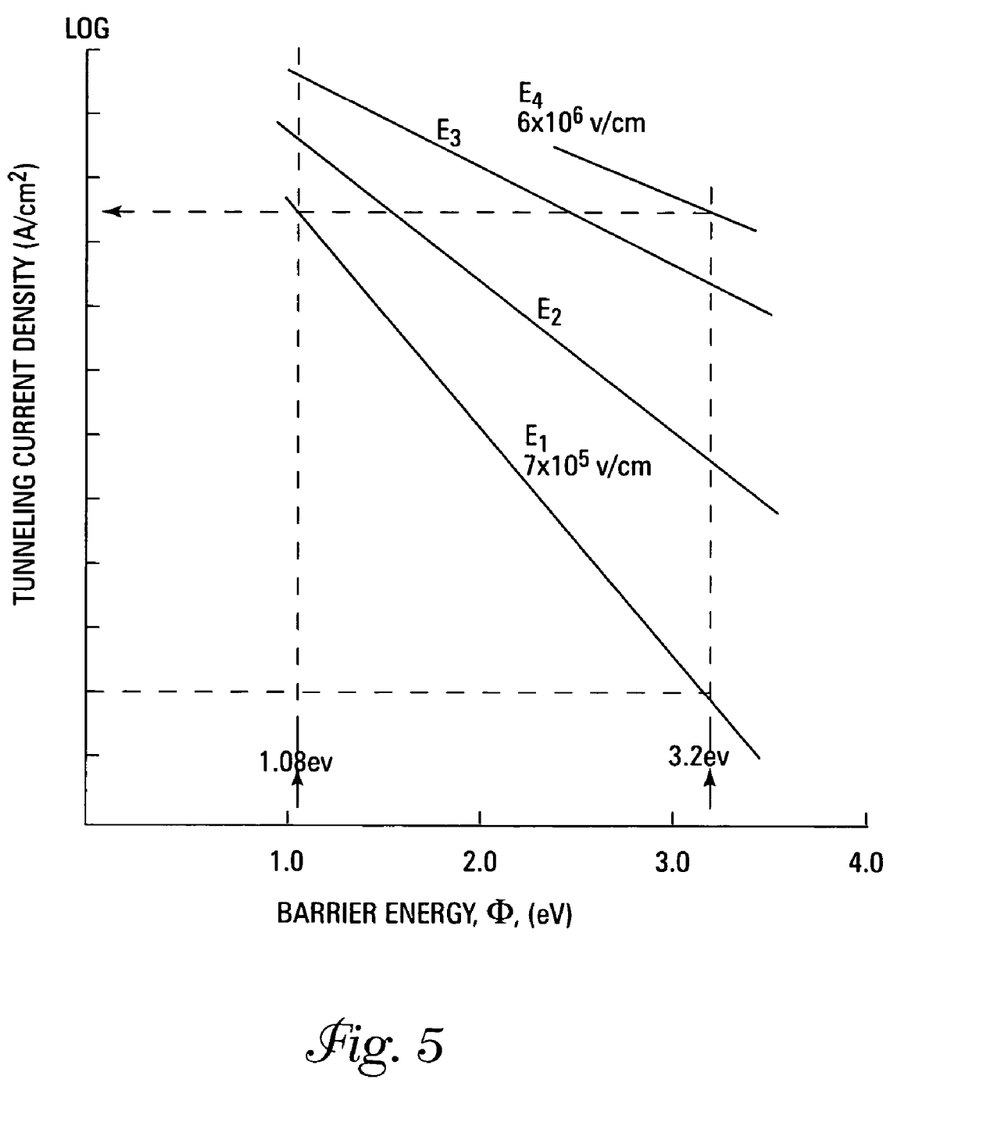
FIG. 5 shows a plot of tunneling current dependence on barrier height for various electric fields in accordance with the transistor structure of FIG. 1.

The high-k tunnel gate dielectric of the present invention reduces the barriers between the substrate and gate insulator and/or between the floating gate and the gate insulator. FIG. 5 illustrates a plot of tunneling current dependence on barrier height for various electric fields in accordance with the transistor structure of FIG. 1. This plot shows that the tunneling current at a fixed electric field can be increased by orders of magnitude as a result of reducing the barriers.

In the specific case of Fowler-Nordheim tunneling, the expression that describes the conduction in the insulator is $J=AE^2 \exp(-B/E)$ where J is the current density in amps/cm$^2$, E is the electric field in the insulator in volts/cm and A and B are constants for a particular insulator. The constants depend on the effective mass and the electron barrier energy of the insulator and are scaled with the barrier energy, $\Phi$, as $A \propto (1/\Phi)$ and $B \propto (\Phi)3/2$.

For the case of the commonly used gate insulator, $SiO_2$, the equation above renders $A(SiO_2—Si)=5.5\times10^{-16}$ amps/volt$^2$ and $B(SiO_2—Si)=7.07\times10^7$ V/cm. If a new barrier of $\Phi=1.08$ eV is utilized, likely values for A and B can be extrapolated from the above equations. In this case, $A(\Phi=1.08\ eV)=1.76\times10^{-15}$ amps/volt$^2$ and $B(\Phi=1.08\ eV)=1.24\times10^7$ V/cm.

Curves of J versus the barrier energy, F, are shown in FIG. 5 for several values of E. For a given tunneling current, lower barriers require lower electric fields. As an example, an $SiO_2$ barrier of 3.2 eV has an electric field of $6\times10^6$ V/cm while for the same tunneling current, a high-k dielectric with a 1.08 eV barrier requires only an electric field of $7\times10^5$ V/cm. If the thicknesses of the two dielectrics are the same then the voltage required will be about 8.6 times less for the same current. If the high-k dielectric has a dielectric constant of 28, then the equivalent oxide thickness (EOT) will be 7 times less than the actual thickness of the high-k dielectric.

The NROM memory transistors of the present invention can thus be designed with very small equivalent oxide thicknesses and scaled into the 50 nm dimensions without drain turn-on problems, short-channel effects, and punch through. Additionally, retention times will decrease due to more thermal excitation and emission of electrons over the smaller barriers.

Figure 6:
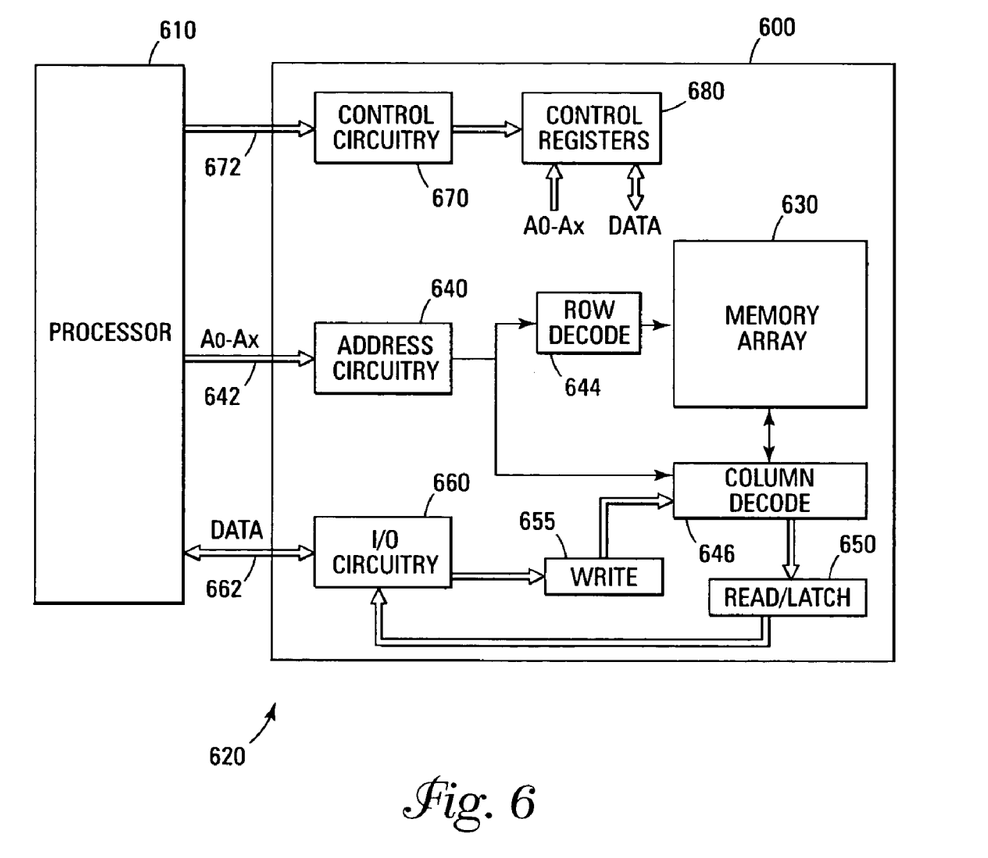
FIG. 6 shows a block diagram of an electronic system of the present invention.

FIG. 6 illustrates a functional block diagram of a memory device 600 that can incorporate the flash memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of flash memory cells 630 that can be NROM flash memory cells. The memory array 630 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller.

Since the NROM memory cells of the present invention use a CMOS compatible process, the memory device 600 of FIG. 6 may be an embedded device with a CMOS processor.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, an NROM cell can use a high-k dielectric as the trapping layer. The high-k dielectric can be fabricated using atomic layer deposition, evaporation, or a combination of the two processes. The high-k dielectric enables smaller write and erase voltages to be used and eliminates drain turn-on problems, short-channel effects, and punch through.

The NROM flash memory cells of the present invention may be NAND-type cells, NOR-type cells, or any other type of array architecture.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating an NROM memory cell, the method comprising:

creating a plurality of source/drain regions by doping portions of a substrate;

forming a nanolaminate gate dielectric layer on the substrate substantially between the plurality of source/drain regions, wherein forming the gate dielectric layer comprises forming one of the following structures: oxide-$HfO_2$-oxide, oxide-$ZrO_2$-oxide, oxide-ZrSnTiO-oxide, oxide-ZrON-oxide, oxide-ZrAlO-oxide, oxide-$ZrTiO_4$-oxide, oxide-$Al_2O_3$-oxide, oxide-$La_2O_3$-oxide, oxide-$LaAlO_3$-oxide, oxide-$HfAlO_3$-oxide, oxide-HfSiON-oxide, oxide-$Y_2O_3$-oxide, oxide-$Gd_2O$-oxide, oxide-$Ta_2O_5$-oxide, oxide-$TiO_2$-oxide, oxide-$Pr_2O_3$-oxide, oxide-$CrTiO_3$-oxide, or oxide-YSiO-oxide; and forming a gate on the gate dielectric layer;

wherein forming the nanolaminate gate dielectric layer on the substrate comprises forming a first oxide layer on the substrate, forming a metal layer on the first oxide layer, converting the metal layer to a dielectric form and forming a second oxide layer on the metal layer after converting it to its dielectric form.

2. The method of claim 1 wherein the plurality of source/drain regions are p+ regions in an n+ substrate.

3. The method of claim 1 wherein the plurality of source/drain regions are n+ regions in a p+ substrate.

4. The method of claim 1 wherein the substrate is silicon.

5. The method of claim 1 wherein gate is polysilicon.

6. The method of claim 1 wherein the metal layer of the gate dielectric layer is formed from atomic layer deposition. layer deposition.

* * * * *